United States Patent [19]
Harima

[11] Patent Number: 5,835,423
[45] Date of Patent: Nov. 10, 1998

[54] SEMICONDUCTOR MEMORY

[75] Inventor: Takayuki Harima, Kawaguchi, Japan

[73] Assignee: Kabushiki Kaisha Toshiba, Tokyo, Japan

[21] Appl. No.: 838,508

[22] Filed: Apr. 8, 1997

[30] Foreign Application Priority Data

Apr. 9, 1996 [JP] Japan .................................. 8-086865

[51] Int. Cl.$^6$ .................................................. G11C 7/00
[52] U.S. Cl. ..................... 365/194; 365/233.5; 365/205; 365/154; 365/189.09
[58] Field of Search ............................. 365/194, 233.5, 365/205, 154, 189.09, 202, 207

[56] References Cited

U.S. PATENT DOCUMENTS

| | | | |
|---|---|---|---|
| 4,947,379 | 8/1990 | Okuyama | 365/233.5 |
| 5,245,584 | 9/1993 | Zampaglione et al. | 365/194 X |
| 5,424,985 | 6/1995 | McClure et al. | 365/194 |
| 5,566,130 | 10/1996 | Durham et al. | 365/233.5 |
| 5,642,319 | 6/1997 | Nagashima | 365/194 X |

*Primary Examiner*—Huan Hoang
*Attorney, Agent, or Firm*—Loeb & Loeb LLP

[57] ABSTRACT

A semiconductor device comprises: a memory cell array which has a plurality of memory cell to output data from a memory cell selected on the basis of an externally input signal; a sense amplifier for receiving the data output from said memory cell array, amplifying the data, and outputting the data; and a pulse generator for receiving the input signal and outputting a pulse for determining a timing at which said sense amplifier is activated, wherein said pulse generator includes a circuit pattern electrically equivalent to elements included in said memory cell. According to the above device, the pulse generator includes the same pattern as that of elements included in the memory cell. When the operation speed of the memory cell varies due to the manufacturing process, etc, the variation can be canceled by a similar variation, so that an erroneous operation of the sense amplifier is prevented and the operation speed can be increased.

24 Claims, 9 Drawing Sheets

SEMICONDUCTOR MEMORY

BACKGROUND OF THE INVENTION

The present invention relates to a semiconductor memory and, more particularly, to a device including a delay unit which is used in a semiconductor memory such as an SRAM (Static Random Access Memory).

In a semiconductor memory, to increase the access speed, a pulse is generated upon detecting a change in externally input address signal or the like, and this pulse is used to activate a sense amplifier or equalize bit lines.

Figure 1:
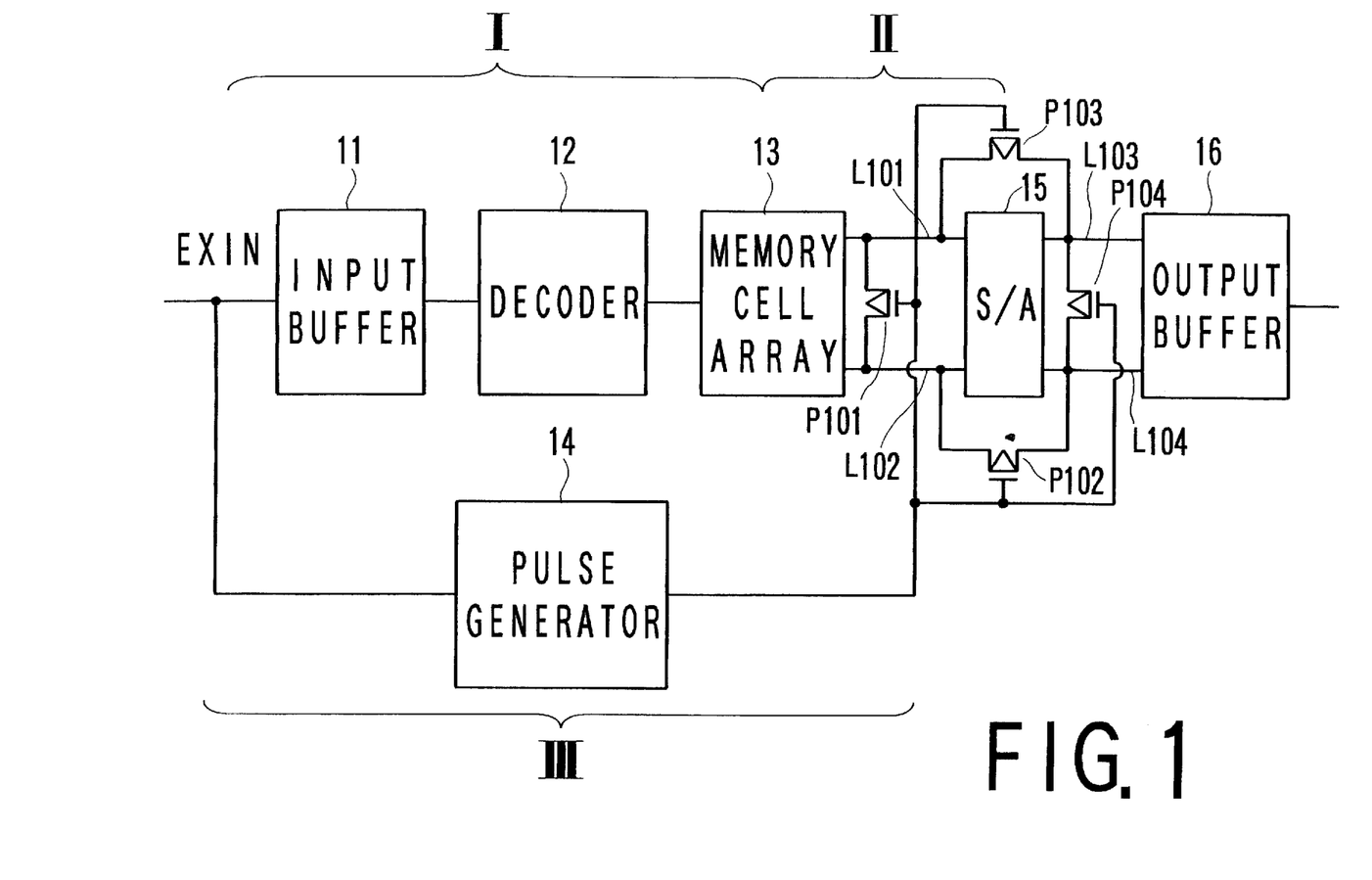
FIG. 1 is a block diagram showing the schematic arrangement of a semiconductor memory to which the present invention can be applied.

FIG. 1 shows the schematic arrangement of a semiconductor memory related to the present invention. An external address signal is input to and amplified by an input buffer 11. The amplified signal is input to and decoded by a decoder 12. The decoded signal is supplied to a memory cell array 13. The memory cell array 13 supplies data stored in a memory cell, which is selected on the basis of the decoded signal, to a sense amplifier 15 via a pair of signal lines L101 and L102. The sense amplifier 15 amplifies the data with a small amplitude from the pair of signal lines L101 and L102 and supplies the data to an output buffer 16 via a pair of signal lines L103 and L104. The output buffer 16 amplifies this data and outputs the data.

The address signal is also supplied to a pulse generator 14. Upon detecting a change in address signal, a pulse of low level which is delayed by a predetermined time is output. This pulse is input to the gates of a P-channel transistor P101 having the two terminals respectively connected to the signal lines L101 and L102, a P-channel transistor P102 having the two terminals respectively connected to the signal lines L103 and L104, a P-channel transistor P103 having the two terminals respectively connected to the signal lines L101 and L103, and a P-channel transistor P102 having the two terminals respectively connected to the signal lines L102 and L104. With this operation, all the transistors P101 to P104 are turned on, so that all the signal lines L101 to L104 are set at an equipotential.

After the above-described equalization according to the pulse output from the pulse generator 14 is completed, the sense amplifier 15 is activated. As the timing at which the pulse is output from the pulse generator 14 and supplied to the transistors P101 to P104 advances, the data can be read out at a higher speed.

However, if the time from the change in externally input address signal to the end of equalization upon completion of output of the pulse from the pulse generator 14 is shorter than the time required from the change in address signal and selection of the memory cell in the memory cell array 13 via the input buffer 11 and the decoder 12 to the end of propagation of the data read out from the selected memory cell to the input terminal of the sense amplifier 15, the data to be input to the sense amplifier 15 is not determined yet at the time of activation of the sense amplifier 15, resulting in an erroneous operation of the sense amplifier 15.

The data to be input to the sense amplifier 15 must be determined until output of the pulse from the pulse generator 14 is ended and equalization is completed. The delay time from the change in address signal to the end of equalization is set with some margin. The equalization end time is set by a delay unit incorporated in the pulse generator 14. The delay unit is generally constituted by a logic circuit similar to a peripheral circuit such as an inverter using transistors. The delay time is set by changing the number of inverters or adding a gate capacitance or linear capacitance to each node.

Figure 2:
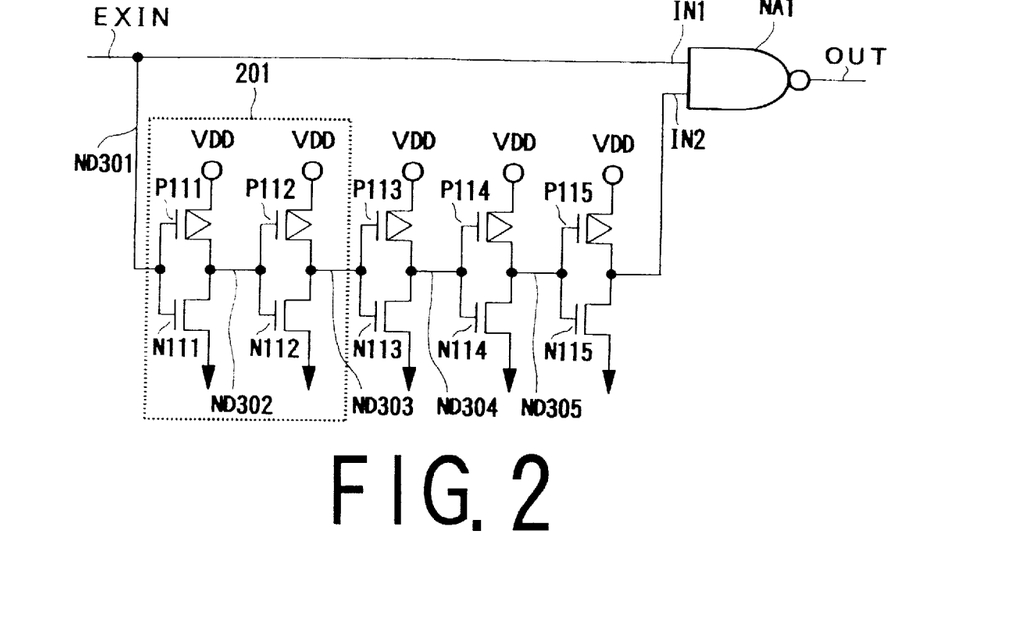
FIG. 2 is a circuit diagram showing the arrangement of a delay unit in the semiconductor memory related to the present invention.
Figure 3:
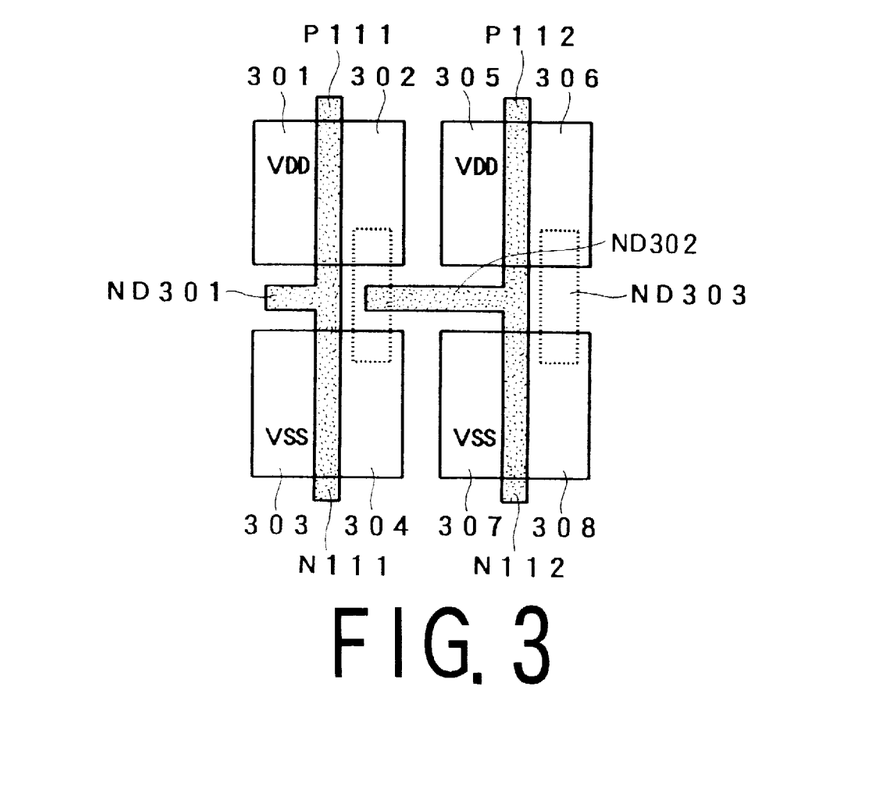
FIG. 3 is a plan view showing the circuit pattern of an inverter array in the delay unit.

FIG. 2 shows the arrangement of the delay unit. An inverter consisting of a P-channel transistor P111 and an N-channel transistor N111, an inverter consisting of a P-channel transistor P112 and an N-channel transistor N112, an inverter consisting of a P-channel transistor P113 and an N-channel transistor N113, an inverter consisting of a P-channel transistor P114 and an N-channel transistor N114, and an inverter consisting of a P-channel transistor P115 and an N-channel transistor N115 are connected in series between an external input terminal EXIN and one input terminal IN2 of a two-input NAND circuit NA1. This inverter array is realized by a pattern as shown in FIG. 3 when a circuit 201 including the inverter consisting of the P-channel transistor P111 and the N-channel transistor N111 and the inverter consisting of the P-channel transistor P112 and the N-channel transistor N112 is taken as an example.

A source region 301 applied with a power supply voltage VDD and a drain region 302 of the transistor P111, a grounded source region 303 and a drain region 304 of the transistor N111, a node ND301 connected to the external input terminal EXIN, commonly connected to the gates of the transistors P111 and N111, and formed of polysilicon or the like, a source region 305 applied with the power supply voltage VDD and a drain region 306 of the transistor P112, a grounded source region 307 and a drain region 308 of the transistor N112, a node ND302 commonly connected to the drain regions 302 and 304 and the gates of the transistors P112 and N112 and formed of polysilicon or the like, and a node ND303 for connecting the drain region 306 to the drain region 308 are formed on the surface of a semiconductor substrate.

Figure 4:
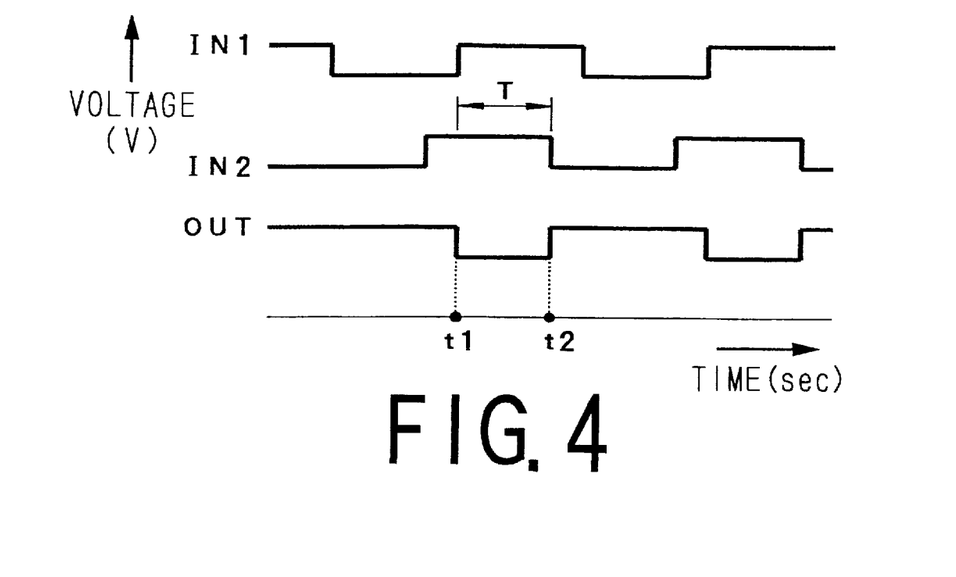
FIG. 4 is a timing chart showing the operation waveforms of the delay unit.

FIG. 4 shows changes in potentials of one input terminal IN1 of the NAND circuit NA1, which is connected to the external input terminal EXIN, the other input terminal IN2, and an output terminal OUT. The potential of the output terminal OUT goes to low level at time t1 when the potential of one input terminal IN1 of the NAND circuit NA1 goes high. The potential of the output terminal OUT goes to high level at time t2 when the potential of the other input terminal IN2 goes low. A pulse of low level with such a pulse width T is output.

The P-channel transistors P101 to P104 are turned on and equalized in accordance with the pulse output from the pulse generator 14. Equalization starts at time t1 which is determined on the basis of the level of the input terminal IN1 and ends at time t2 which is determined on the basis of the level of the input terminal IN2. An important time point for preventing the erroneous operation of the sense amplifier 15 is time t2 at which equalization ends. Time t2 is determined by the N-channel transistor N111 for discharging the output node ND302 of the first inverter.

The time from input of the input signal to the buffer 11 to determination of data to be input to the sense amplifier 15 may be sometimes longer than a designed value because the transistor characteristics constituting the memory cells of the memory cell array 13 vary due to the manufacturing process or the like.

The system consisting of the external input terminal EXIN, the input buffer 11, the decoder 12, and the memory cell array 13 will be referred to as a system I, the system from the memory cell array 13 to the sense amplifier 15 will be referred to as a system II, and the system from the external input terminal EXIN to the pulse generator 14 will be referred to as a system III. The propagation times in these systems are represented by TI, TII, and TIII, respectively. A condition for preventing the erroneous operation of the sense amplifier 15 is given by inequality (1) below:

$$(TI+TII)<TIII \tag{1}$$

The circuits of the systems I and III are arranged at the peripheral portion of the semiconductor substrate while the circuit of the system II is arranged in the core area. The wiring width of the system II tends to be larger than that of the remaining systems because of the difference in pattern density, i.e., a loading effect is generated. For this reason, the system II has characteristics different from those of the systems I and III. The memory cell array 13 has transistor characteristics which are inherent to the memory cells and different from those of the pulse generator 14 as a peripheral circuit. When the propagation time TII in the system II changes to TII'(>TII), the relationship among the propagation times in the systems I, II, and III can be represented by TI+TII'>TIII. As a result, when activation of the sense amplifier 15 is completed, data to be input to the sense amplifier 15 is not determined yet, resulting in an erroneous operation. To prevent this erroneous operation, the equalization end time may be set with a margin, though this causes a decrease in access speed.

SUMMARY OF THE INVENTION

The present invention has been made in consideration of the above situation, and has as its object to provide a semiconductor memory capable of preventing an erroneous operation of a sense amplifier and achieving an increase in access speed.

According to the present invention, there is provided a semiconductor device comprising a memory cell array which has a plurality of memory cell to output data from a memory cell selected on the basis of an externally input signal, a sense amplifier for receiving the data output from the memory cell array, amplifying the data, and outputting the data, and a pulse generator for receiving the input signal and outputting a pulse for determining a timing at which the sense amplifier is activated, wherein the pulse generator includes a circuit pattern electrically equivalent to some elements constituting the memory cell.

According to the present invention, there is also provided a semiconductor device comprising an input buffer for receiving an external input signal, amplifying the input signal, and outputting the input signal, a decoder for receiving the input signal output from the input buffer, decoding the input signal, and outputting a decoded signal, a memory cell array which has a plurality of memory cell to output data from a memory cell selected on the basis of the decoded signal output from the decoder, a sense amplifier for receiving the data output from the memory cell array, amplifying the data, and outputting a signal, an output buffer for receiving the signal output from the sense amplifier, amplifying the signal, and outputting an output signal, a pulse generator for receiving the input signal and outputting a pulse delayed by a predetermined time, and equalizing means for receiving the pulse output from the pulse generator and equalizing a first pair of signal lines which connect an output terminal of the memory cell array to an input terminal of the sense amplifier and a second pair of signal lines which connect an output terminal of sense amplifier to an input terminal of the output buffer, wherein the pulse generator includes a circuit pattern electrically equivalent to some elements constituting the memory cell.

The memory cell has a driver transistor for holding the data, and a transfer transistor for controlling transfer of the data held by the driver transistor, and the delay unit includes a circuit pattern electrically equivalent to the transfer transistor.

Alternatively, the memory cell may have a driver transistor for holding the data, and a transfer transistor for controlling transfer of the data held by the driver transistor, and the delay unit may include a circuit pattern electrically equivalent to the driver transistor and the transfer transistor.

Alternatively, the memory cell may have a driver transistor for holding the data, and a transfer transistor for controlling transfer of the data held by the driver transistor, the delay unit may have a logic gate for receiving the input signal at one input terminal and the input signal through at least one inverter at the other input terminal, and outputting the pulse, and the inverter may include a circuit pattern electrically equivalent to the transfer transistor.

According to the semiconductor memory of the present invention, part of the delay unit in the pulse generator includes the same pattern as that of some elements constituting the memory cell. With this arrangement, even when the operation speed of the memory cell varies due to the manufacturing process or the like, the variation can be canceled by a similar variation added to the delay time. Therefore, an erroneous operation of the sense amplifier can be prevented without setting the time for determining data to be input to the sense amplifier with a margin, resulting in an increase in operation speed.

DESCRIPTION OF THE PREFERRED EMBODIMENTS

An embodiment of the present invention will be described below with reference to the accompanying drawings.

Figure 6:
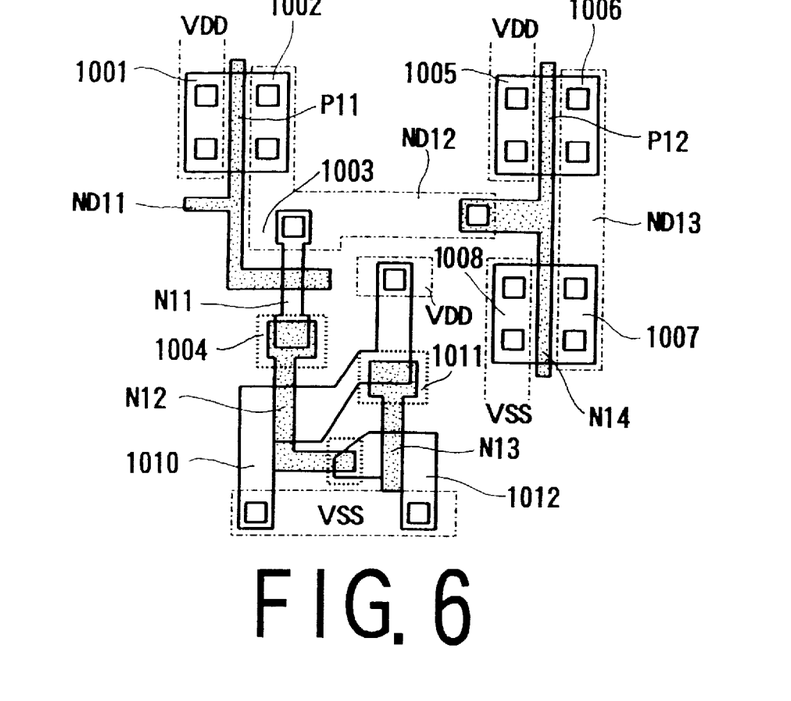
FIG. 6 is a circuit diagram showing the circuit pattern of a delay unit in a semiconductor memory according to the first embodiment of the present invention.

A semiconductor memory of this embodiment shown in FIG. 6 is different from the prior art in the arrangement of the delay unit in a pulse generator 14 with an input terminal connected to an external input terminal EXIN and an output terminal connected to the gates of P-channel transistors P101 to P104. The conventional pulse generator 14 has the NAND circuit NA1 and an inverter array serving as a delay unit, as shown in FIG. 2. In this embodiment, the arrangement and circuit pattern of the inverter array corresponding to the delay unit are different from those shown in FIGS. 2 and 3.

Figure 7:
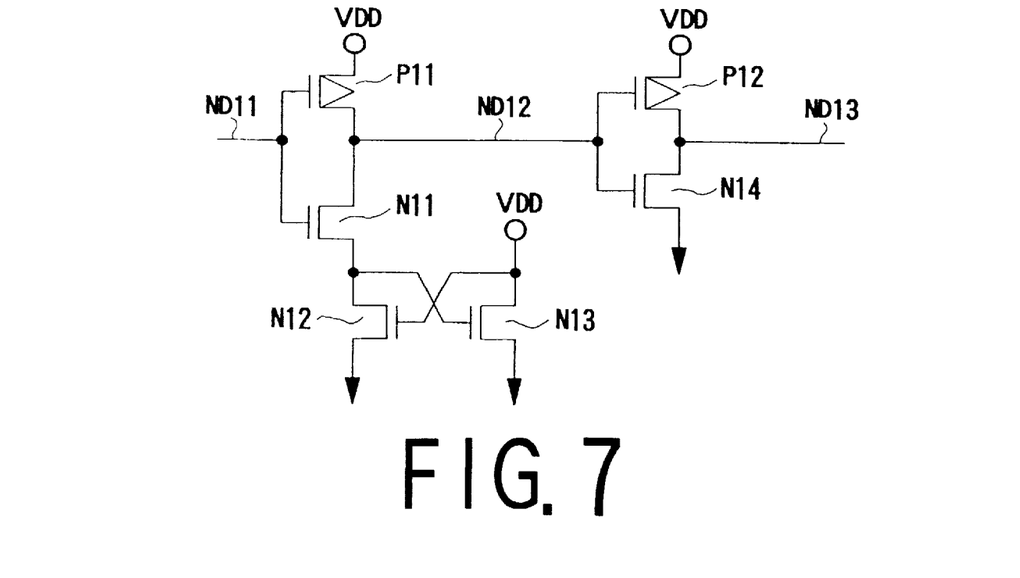
FIG. 7 is a circuit diagram showing the circuit arrangement of the delay unit.

FIG. 7 shows the circuit arrangement of the delay unit of the pulse generator in a semiconductor memory according to the first embodiment. An inverter array in which the first inverter consisting of a P-channel transistor P11 and an N-channel transistor N11 and the second inverter consisting of a P-channel transistor P12 and an N-channel transistor N14 are connected in series is arranged between a node ND11 supplied with an address signal input from the external input terminal EXIN (not shown) and a node ND13 for outputting a delayed signal. Two N-channel transistors N12 and N13 with drains and gates cross-coupled and sources grounded are arranged between the source of the N-channel transistor N11 of the first inverter and the ground terminal. More specifically, the drain of the N-channel transistor N12 and the gate of the N-channel transistor N13 are connected to the source of the N-channel transistor N11, and the gate of the N-channel transistor N12 and the drain of the N-channel transistor N13 are connected to a power supply voltage VDD terminal.

This embodiment is characterized in that the N-channel transistors N11 to N13 are arranged in place of the N-channel transistor N111 of the inverter array in the delay unit shown in FIG. 2. The delay time of the delay unit shown in FIG. 6 is determined by the discharge rate of a node ND12 which connects the drains of the transistors P11 and N11 serving as the output terminal of the first inverter to the gates of the transistors P12 and N14 serving as the input terminal of the second inverter. The arrangement of the N-channel transistors N11 to N13 connected to the node ND12 is electrically equivalent to some elements constituting a memory cell.

Figure 5:
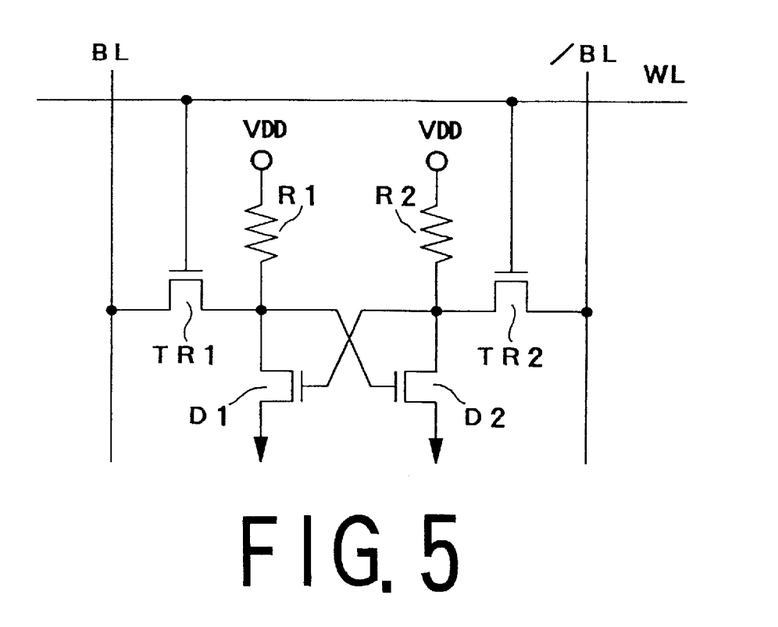
FIG. 5 is a circuit diagram showing the arrangement of a memory cell of an SRAM to which the present invention can be applied.

FIG. 5 shows the arrangement of the a memory cell of a general SRAM. A resistor R1 and an N-channel transistor D1 serving as a driver transistor, and a resistor R2 and an N-channel transistor D2 serving as a driver transistor are connected in parallel between the power supply voltage VDD terminal and the ground terminal. The gates and drains of the driver transistors D1 and D2 are cross-coupled. The two terminals of N-channel transistors TR1 and TR2 serving as transfer gates are connected between a pair of bit lines BL and $\overline{BL}$ and the drains of the driver transistors D1 and D2, respectively. The gates of the transistors TR1 and TR2 are commonly connected to a word line WL.

The characteristics and, particularly, the operation speed of the memory cell with the above arrangement are determined by the circuit pattern of the N-channel transistor TR1 or the circuit pattern of the N-channel transistor TR1 and the driver transistors D1 and D2. The operation speed of the memory cell is determined by the rate of discharge from one terminal of the transistor TR1 to the ground terminal through the transistors D1 and D2. An arrangement electrically equivalent to the transistors TR1, D1, and D2 of the memory cell is realized by the N-channel transistors N11 to N13 in the first inverter of the delay unit. With this arrangement, even when the characteristics of the memory cell vary due to a process variation, a similar variation can be generated in the delay unit.

The arrangement consisting of the N-channel transistors N11 to N13 may be arranged between the second inverter and the ground terminal. Alternatively, the arrangement may be arranged for both the first and second inverters.

FIG. 6 shows the pattern of the N-channel transistors N11 to N13. A drain region 1001 and a source region 1002 of a P-channel transistor are formed on the surface of the semiconductor substrate. The node ND11 connected to a gate electrode formed of a conductive film is formed on a channel region between the drain region 1001 and the source region 1002. A drain region 1003 of the N-channel transistor N11 is rendered conductive with the source region 1002 of the P-channel transistor P11. A source region 1004 of the N-channel transistor N11 is connected to a drain region 1010 of the N-channel transistor N12 and the gate electrode of the N-channel transistor N13. The drain region 1010 of the N-channel transistor N12 and a source region 1012 of the N-channel transistor N13 are grounded. A drain region 1005 of the P-channel transistor P12 is applied with the power supply voltage VDD. A source region 1006 of the P-channel transistor P12 is connected to the node ND13. A drain region 1007 of the N-channel transistor N14 is connected to the node ND13. A source region 1008 of the N-channel transistor N14 is grounded. The gate electrodes of the N-channel transistor N14 and the transistor P12 are connected to the node ND12.

Of these transistor patterns, the pattern of the transistor N11 is the same as that of the transfer transistor of the memory cell, as described above. The patterns of the transistors N12 and N13 are the same as those of the driver transistors D1 and D2.

In this manner, the same circuit arrangement and circuit pattern as those of a transistor for determining the characteristics of the memory cell are formed in the delay unit. With this arrangement, even when the operation time of the memory cell varies due to a process variation or the like, a similar variation is generated in the signal delay time of the delay unit. Therefore, without setting the equalization end time of the input/output terminal of a sense amplifier 15 with a margin, the erroneous operation of the sense amplifier can be prevented, achieving an increase in access speed.

Figure 9:
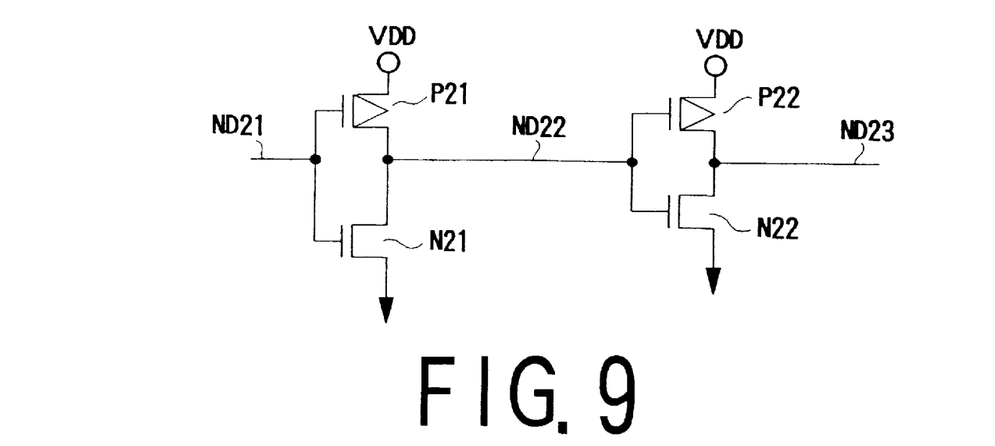
FIG. 9 is a circuit diagram showing the circuit arrangement of the delay unit.

FIG. 9 shows the arrangement of a delay unit in a semiconductor memory according to the second embodiment of the present invention. In this delay unit, the first inverter consisting of a P-channel transistor P21 and an N-channel transistor N21 and the second inverter consisting of a P-channel transistor P22 and an N-channel transistor N22 are connected in series between an node ND21 for receiving an external signal and an node ND23 for outputting the signal.

Figure 8:
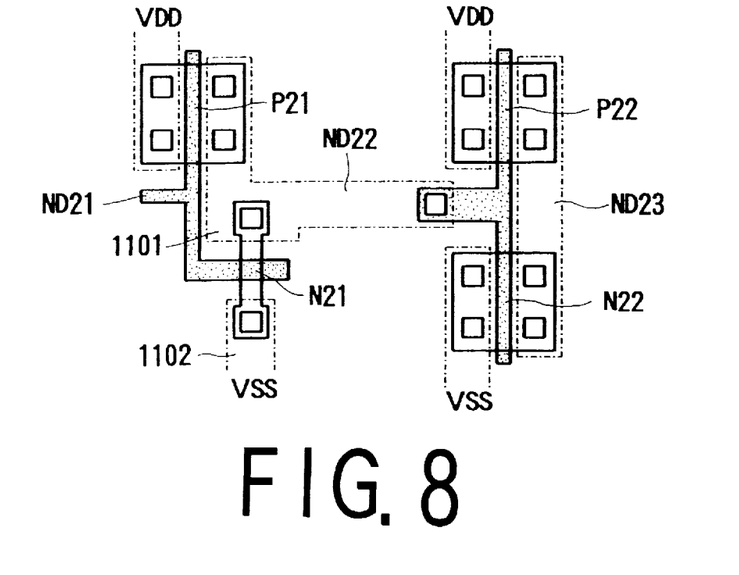
FIG. 8 is a plan view showing the circuit pattern of a delay unit in a semiconductor memory according to the second embodiment of the present invention.

FIG. 8 shows the pattern of the second embodiment. This pattern can be obtained by removing the pattern of the transistors N12 and N13 from the pattern of the first embodiment and grounding a source region 1102 of the transistor N21.

As described above, the N-channel transistor N21 having a drain region 1101 and the source region 1102 is formed to have the same pattern as that of the transfer transistor of a memory cell. With this arrangement, even when the operation time of the memory cell varies, a similar variation is generated in the delay time of the delay unit. Therefore, the variation in operation speed of the memory cell can be canceled by the delay unit.

Figure 11:
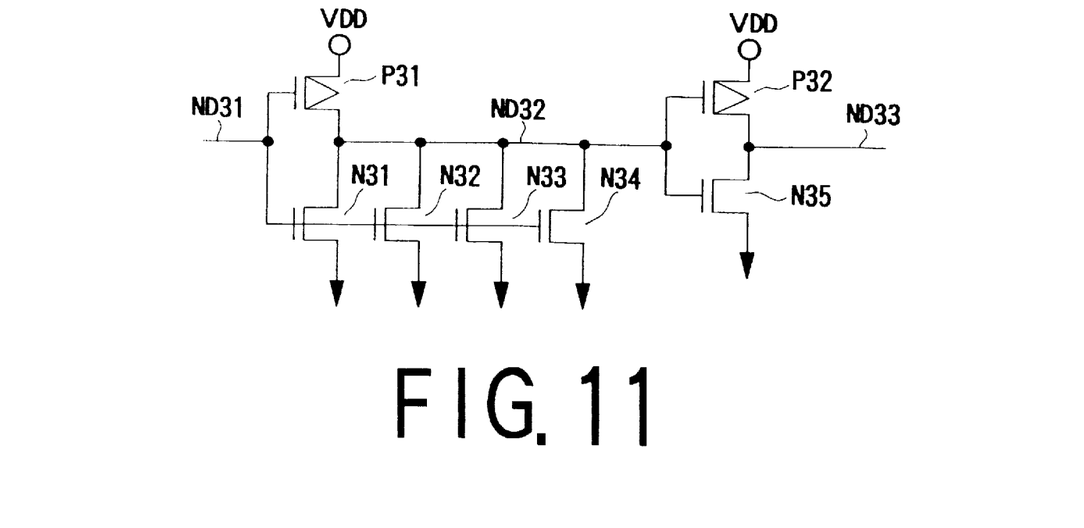
FIG. 11 is a circuit diagram showing the circuit arrangement of the delay unit.

FIG. 11 shows the arrangement of a delay unit in a semiconductor memory according to the third embodiment. In this delay unit, N-channel transistors N32 to N34 are connected in parallel between the ground terminal and a node ND32 which connects the output terminal of the first inverter consisting of a P-channel transistor P31 and an N-channel transistor N31 to the input terminal of the second inverter consisting of a P-channel transistor P32 and an N-channel transistor N35. The gates of the transistor N32 to N34 are connected to a node ND31.

Figure 10:
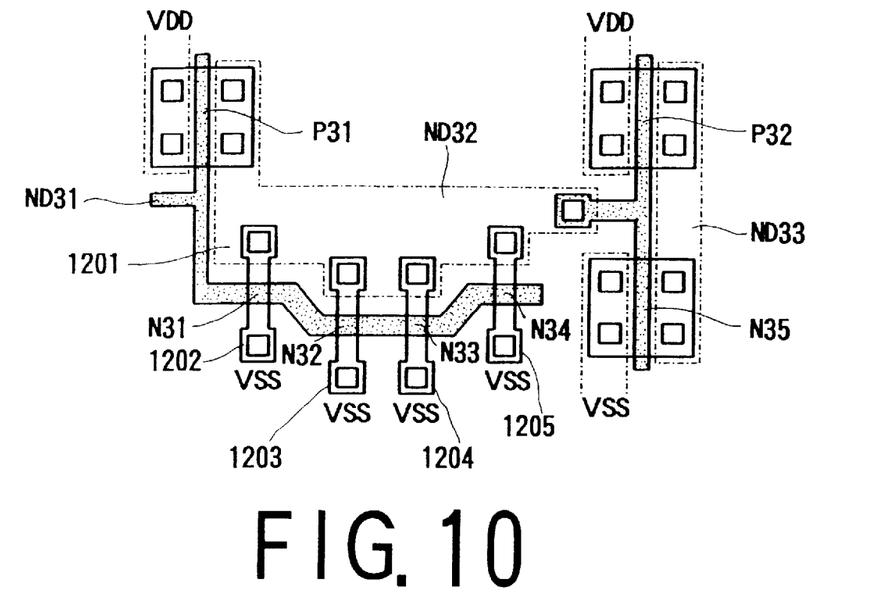
FIG. 10 is a plan view showing the circuit pattern of a delay unit in a semiconductor memory according to the third embodiment of the present invention.

As shown in FIG. 10, the N-channel transistors N32 to N34 have the same pattern. More specifically, the drains of the N-channel transistors N31 to N34 commonly have a drain region 1201. The gate electrodes are commonly connected to the node ND31, and source regions 1202 to 1205 are grounded. Each of the N-channel transistors N31 to N34 has the same pattern as that of the transfer transistor of a memory cell so that a variation similar to the variation in characteristics of the memory cell can be generated in the delay unit.

According to this embodiment, by changing the number of N-channel transistors N31 to N34 for discharging the node ND32, the delay time can be adjusted.

Figure 13:
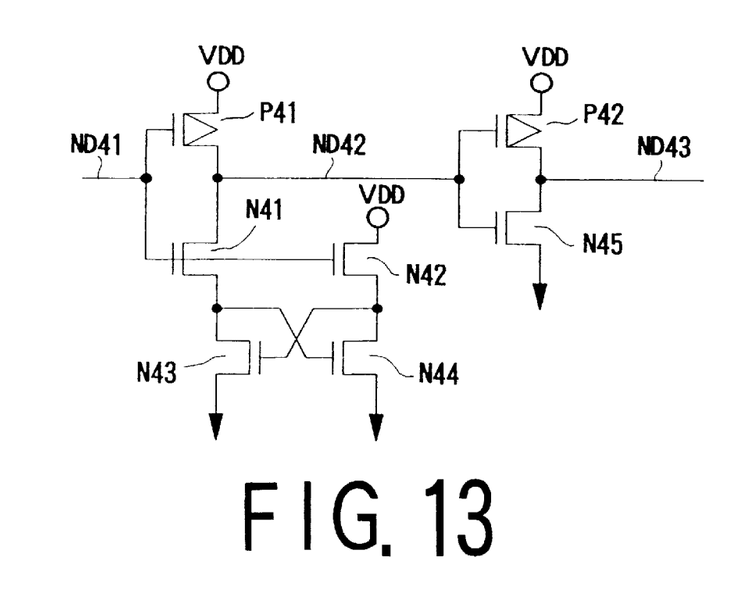
FIG. 13 is a circuit diagram showing the circuit arrangement of the delay unit.

A delay unit in a semiconductor memory according to the fourth embodiment of the present invention has an arrangement shown in FIG. 13. The delay unit has the first inverter consisting of a P-channel transistor P41 and an N-channel transistor N41 and the second inverter consisting of a P-channel transistor P42 and an N-channel transistor N45. The delay unit also has an N-channel transistor N42 having a gate connected to the gate of the transistor N41 and a drain connected to a power supply voltage VDD terminal, and N-channel transistors N43 and N44 having gates and drains cross-coupled and sources grounded. The drain of the transistor N43 is connected to the source of the transistor N41. The drain of the transistor N44 is connected to the source of the transistor N42.

Figure 12:
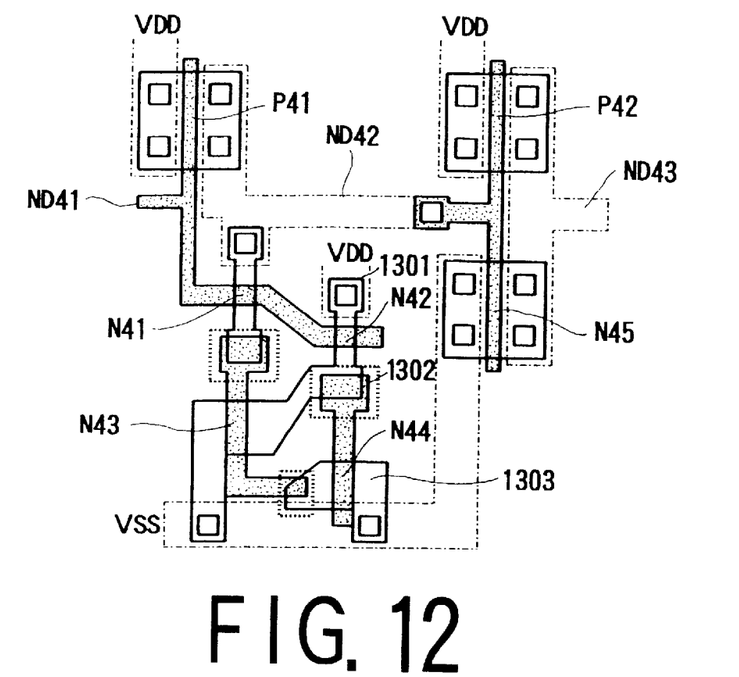
FIG. 12 is a plan view showing the circuit pattern of a delay unit in a semiconductor memory according to the fourth embodiment of the present invention.

The circuit arrangement of the fourth embodiment is different from that of the first embodiment shown in FIG. 6 in that the N-channel transistor N41 having the two terminals connected between the power supply voltage VDD terminal and the drain of the N-channel transistor N44 is added. FIG. 12 shows the circuit pattern of this embodiment. The circuit pattern is different from that of the first embodiment shown in FIG. 6 in that the transistor N42 having a drain region 1301 applied with the power supply voltage VDD, a gate connected to a node ND41, and a source region 1302 connected to a drain region 1303 of the N-channel transistor N42 and the gate electrode of the N-channel transistor N43 is added.

In the fourth embodiment as well, the N-channel transistor N41 has the same pattern as that of the transfer transistor of a memory cell, as in the first embodiment. Therefore, the delay time of the delay unit can be changed in accordance with the variation in operation time of the memory cell.

Figure 15:
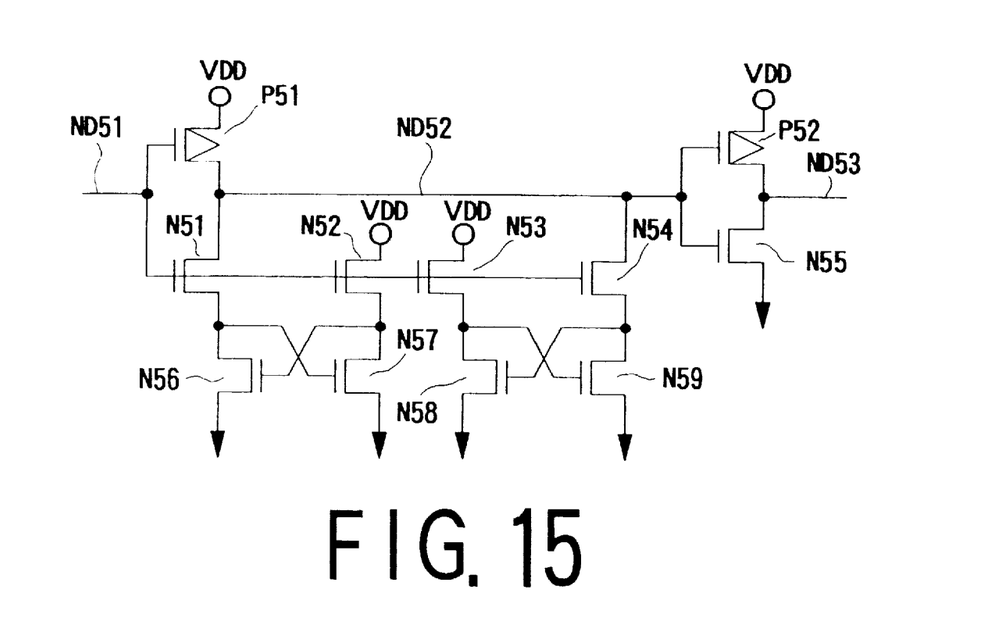
FIG. 15 is a circuit diagram showing the circuit arrangement of the delay unit.

The fifth embodiment of the present invention has an arrangement shown in FIG. 15. In addition to an inverter consisting of a P-channel transistor P51 and an N-channel transistor N51 and an inverter consisting of a P-channel transistor P52 and an N-channel transistor N55, N-channel transistors N52 to N54 and N-channel transistors N56 to N59 having grounded sources are added. The gates of the transistors N51 to N54 are commonly connected, and the drains of the transistors N52 and N53 are connected to a power supply voltage VDD terminal. The gates and drains of the transistors N56 and N57 are cross-coupled. The gates and drains of the transistors N58 and N59 are cross-coupled.

Figure 14:
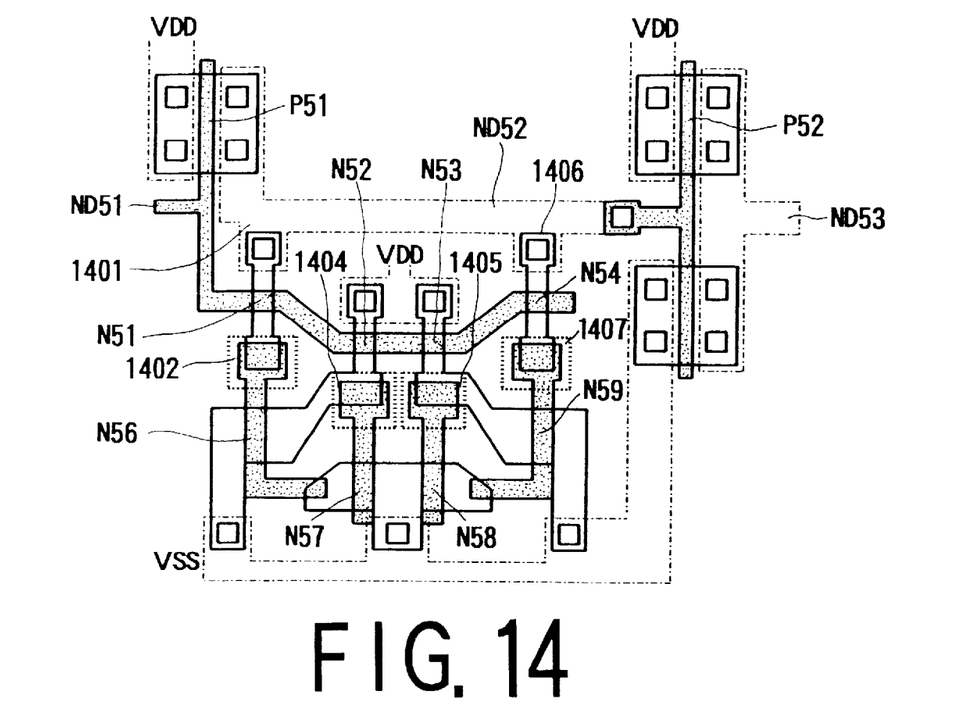
FIG. 14 is a plan view showing the circuit pattern of a delay unit in a semiconductor memory according to the fifth embodiment of the present invention.

In the fifth embodiment, each of the transistors N51 to N54 for determining the discharge rate of a node ND52 has the same pattern as that of the transfer transistor of a memory cell. FIG. 14 shows the circuit pattern of this embodiment. The transistor N51 has a drain region 1401 connected to the node ND52 and a source region 1402. The transistor N52 has a drain region 1403 applied with the power supply voltage VDD and a source region 1404. The transistor N53 has the drain region 1403 common to the transistor N52 and a source region 1405. The transistor N59 has a drain region 1406 connected to the node ND52 and a source region 1407. The pattern of each of the transistors N51 to N54 is the same as that of the above-described transfer gate transistor of the memory cell, so that a variation similar to the variation in operation speed of the memory cell can be generated in the delay unit.

Figure 16:
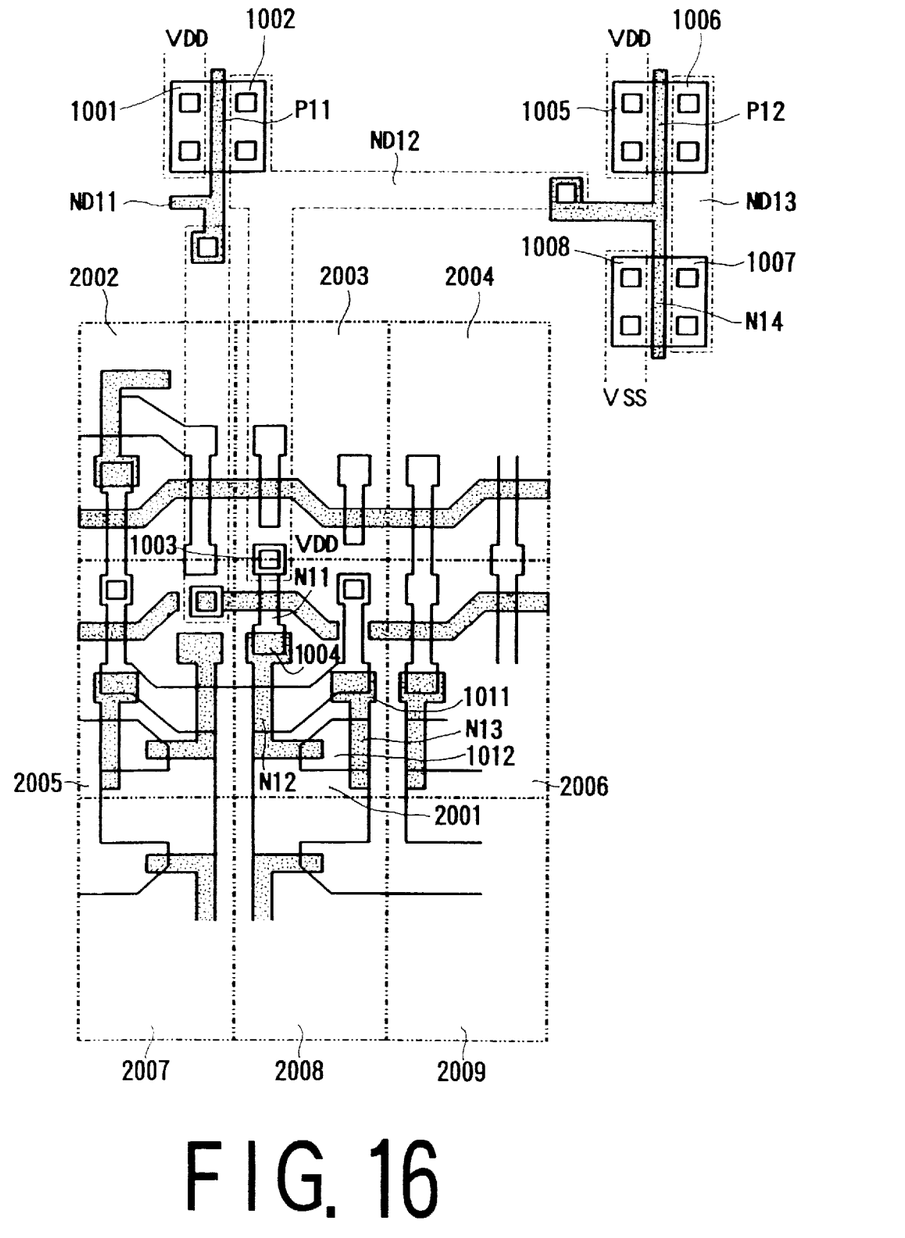
FIG. 16 is a plan view showing the circuit pattern of a delay unit in a semiconductor memory according to the sixth embodiment of the present invention.

FIG. 16 shows the circuit pattern of a delay unit in a semiconductor memory according to the sixth embodiment of the present invention. The circuit arrangement of this delay unit is the same as that of the first embodiment shown in FIG. 6. The same reference numerals as in FIG. 7 denote the same regions in FIG. 16.

In the sixth embodiment, of regions 2001 to 2009 indicated by alternate long and two-dashed lines, only the region 2001 operates as a circuit. Each of the remaining regions 2002 to 2009 has the same pattern as the circuit pattern of a memory cell, though these patterns are dummy patterns and do not operate as a circuit. The purpose of forming these dummy patterns is to reflect, on the region 2001, the influence of a variation in operation speed of the memory cell caused by a variation in manufacturing process. With this arrangement, when the operation speed of the memory cell varies, a similar variation can be added to the delay time of the delay unit more properly than the other embodiments.

The above-described embodiments are only examples, and the present invention is not limited to these embodiments. For example, in the second embodiment shown in FIGS. 3 and 4, the delay unit is constituted by an array of two inverters, and one of the inverters has the N-channel transistor N21 with the same pattern as that of the transfer transistor of the memory cell. However, the N-channel transistor N22 of the other inverter may have the same pattern as that of the transfer gate. Alternatively, all the N-channel transistors of an array of three or more inverters may have the same pattern as that of the transfer gate transistor.

What is claimed is:

1. A semiconductor device comprising:

a memory cell array which has a plurality of memory cells to output data from a memory cell selected on the basis of an externally input signal;

a sense amplifier for receiving the data output from said memory cell array, amplifying the data, and outputting the data;

a pulse generator for receiving the input signal and outputting a pulse for determining a timing at which said sense amplifier is activated, said pulse generator having a delay unit for receiving the input signal, delaying the input signal, and outputting the input signal, and a logic circuit for receiving the input signal and the input signal delayed by said delay unit, comparing a level of the input signal with that of the delayed input signal, and generating the pulse, said delay unit including an inverter array in which a plurality of inverters are connected in series, said inverter array having at least one inverter including a circuit pattern electrically equivalent to elements included in said memory cell, wherein said memory cell has a driver transistor for holding the data, and a transfer transistor for controlling transfer of the data held by said driver transistor, and said at least one inverter includes the circuit pattern electrically equivalent to said transfer transistor.

2. A semiconductor device comprising:

a memory cell array which has a plurality of memory cells to output data from a memory cell selected on the basis of an externally input signal;

a sense amplifier for receiving the data output from said memory cell array, amplifying the data, and outputting the data;

a pulse generator for receiving the input signal and outputting a pulse for determining a timing at which said sense amplifier is activated, said pulse generator having a delay unit for receiving the input signal, delaying the input signal, and outputting the input signal, and a logic circuit for receiving the input signal and the input signal delayed by said delay unit, comparing a level of the input signal with that of the delayed input signal, and generating the pulse, said delay unit including an inverter array in which a plurality of inverters are connected in series. said inverter array having at least one inverter including a circuit pattern electrically equivalent to elements included in said memory cell, wherein at least one inverter of said inverter array included in said delay unit has a P-channel MOS transistor having a source connected to a power supply voltage terminal and a gate supplied with the input signal and an N-channel MOS transistor having a drain connected to a drain of said P-channel MOS transistor, a gate supplied with the input signal, and a source grounded, and a circuit pattern of said N-channel MOS transistor is electrically equivalent to elements included in said memory cell.

3. A memory according to claim 2, wherein said memory cell has a driver transistor for holding the data, and a transfer transistor for controlling transfer of the data held by said driver transistor, and said N-channel MOS transistor includes a circuit pattern electrically equivalent to said transfer transistor.

4. A semiconductor device comprising:

a memory cell array which has a plurality of memory cells to output data from a memory cell selected on the basis of an externally input signal;

a sense amplifier for receiving the data output from said memory cell array, amplifying the data, and outputting the data;

a pulse generator for receiving the input signal and outputting a pulse for determining a timing at which said sense amplifier is activated, said pulse generator having a delay unit for receiving the input signal. delaying the input signal, and outputting the input signal, and a logic circuit for receiving the input signal and the input signal delayed by said delay unit. comparing a level of the input signal with that of the delayed input signal, and generating the pulse, said delay unit including an inverter array in which a plurality of inverters are connected in series, said inverter array having at least one inverter including a circuit pattern electrically equivalent to elements included in said memory cell, wherein at least one inverter of said inverter array included in said delay unit has a P-channel MOS transistor having a source connected to a power supply voltage terminal and a gate supplied with the input signal, a first N-channel MOS transistor having a drain connected to a drain of said P-channel MOS transistor and a gate supplied with the input signal, and second N-channel MOS transistor having a drain connected to a source of said first N-channel MOS transistor, a gate connected to said power supply voltage terminal, and a source grounded, and a third N-channel MOS transistor having a drain connected to said power supply voltage terminal, a gate connected to said drain of said second N-channel MOS transistor, and a source grounded, and a circuit pattern of each of said first, second, and third N-channel MOS transistors is electrically equivalent to elements included in said memory cell.

5. A memory according to claim 4, wherein said memory cell has a driver transistor for holding the data, and a transfer transistor for controlling transfer of the data held by said driver transistor, said first N-channel MOS transistor includes a circuit pattern electrically equivalent to said transfer transistor, and each of said second and third N-channel MOS transistors includes a circuit pattern electrically equivalent to said driver transistor.

6. A semiconductor device comprising:

a memory cell array which has a plurality of memory cells to output data from a memory cell selected on the basis of an externally input signal;

a sense amplifier for receiving the data output from said memory cell array, amplifying the data, and outputting the data;

a pulse generator for receiving the input signal and outputting a pulse for determining a timing at which said sense amplifier is activated, said pulse generator having a delay unit for receiving the input signal, delaying the input signal, and outputting the input signal, and a logic circuit for receiving the input signal and the input signal delayed by said delay unit, comparing a level of the input signal with that of the delayed input signal, and generating the pulse, said delay unit including an inverter array in which a plurality of inverters are connected in series, said inverter array having at least one inverter including a circuit pattern electrically equivalent to elements included in said memory cell, wherein at least one inverter of said inverter array included in said delay unit has a P-channel MOS transistor having a source connected to a power supply voltage terminal and a gate supplied with the input signal, a first N-channel MOS transistor having a drain connected to a drain of said P-channel MOS transistor, a gate supplied with the input signal, and a source grounded, and a second N-channel MOS transistor having a drain connected to said drain of said first N-channel MOS transistor, a gate connected to said gate of said first N-channel MOS transistor, and a source grounded, and a circuit pattern of each of said first and second N-channel MOS transistors is electrically equivalent to elements included in said memory cell.

7. A memory according to claim 6, wherein said memory cell has a driver transistor for holding the data, and a transfer transistor for controlling transfer of the data held by said driver transistor, and each of said first and second N-channel MOS transistors includes a circuit pattern electrically equivalent to said transfer transistor.

8. A semiconductor device comprising:
   a memory cell array which has a plurality of memory cells to output data from a memory cell selected on the basis of an externally input signal;
   a sense amplifier for receiving the data output from said memory cell array, amplifying the data, and outputting the data;
   a pulse generator for receiving the input signal and outputting a pulse for determining a timing at which said sense amplifier is activated,
   said pulse generator having a delay unit for receiving the input signal, delaying the input signal, and outputting the input signal, and a logic circuit for receiving the input signal and the input signal delayed by said delay unit, comparing a level of the input signal with that of the delayed input signal, and generating the pulse,
   said delay unit including an inverter array in which a plurality of inverters are connected in series, said inverter array having at least one inverter including a circuit pattern electrically equivalent to elements included in said memory cell,
   wherein at least one inverter of said inverter array included in said delay unit has a P-channel MOS transistor having a source connected to a power supply voltage terminal and a gate supplied with the input signal, a first N-channel MOS transistor having a drain connected to a drain of said P-channel MOS transistor and a gate supplied with the input signal, a second N-channel MOS transistor having a drain connected to said power supply voltage terminal and a gate connected to said gate of said first N-channel MOS transistor, a third N-channel MOS transistor having a drain connected to a source of said first N-channel MOS transistor, a gate connected to a source of said second N-channel MOS transistor, and a source grounded, and a fourth N-channel MOS transistor having a drain connected to said source of said second N-channel MOS transistor, a gate connected to said source of said first N-channel MOS transistor, and a gate grounded, and a circuit pattern of said first N-channel MOS transistor is electrically equivalent to elements included in said memory cell.

9. A memory according to claim 8, wherein said memory cell has a driver transistor for holding the data, and a transfer transistor for controlling transfer of the data held by said driver transistor, and said first N-channel MOS transistor includes a circuit pattern electrically equivalent to said transfer transistor.

10. A semiconductor device comprising:
   a memory cell array which has a plurality of memory cells to output data from a memory cell selected on the basis of an externally input signal;
   a sense amplifier for receiving the data output from said memory cell array, amplifying the data, and outputting the data;
   a pulse generator for receiving the input signal and outputting a pulse for determining a timing at which said sense amplifier is activated,
   said pulse generator having a delay unit for receiving the input signal, delaying the input signal, and outputting the input signal, and a logic circuit for receiving the input signal and the input signal delayed by said delay unit, comparing a level of the input signal with that of the delayed input signal, and generating the pulse,
   said delay unit including an inverter array in which a plurality of inverters are connected in series, said inverter array having at least one inverter including a circuit pattern electrically equivalent to elements included in said memory cell,
   wherein at least one inverter of said inverter array included in said delay unit has a P-channel MOS transistor having a source connected to a power supply voltage terminal and a gate supplied with the input signal, a first N-channel MOS transistor having a drain connected to a drain of said P-channel MOS transistor and a gate supplied with the input signal, a second N-channel MOS transistor having a drain connected to said power supply voltage terminal and a gate connected to said gate of said first N-channel MOS transistor, a third N-channel MOS transistor having a drain connected to a source of said first N-channel MOS transistor, a gate connected to a source of said second N-channel MOS transistor, and a source grounded, a fourth N-channel MOS transistor having a drain connected to said source of said second N-channel MOS transistor, a gate connected to said source of said first N-channel MOS transistor, and a gate grounded, a fifth N-channel MOS transistor having a drain connected to said power supply voltage terminal and a gate connected to said gate of said first N-channel MOS transistor, a sixth N-channel MOS transistor having a drain connected to said drain of said N-channel MOS transistor and a gate connected to said gate of said first N-channel MOS transistor, a seventh N-channel MOS transistor having a drain connected to a source of said fifth N-channel MOS transistor, a gate connected to a source of said sixth N-channel MOS transistor, and a source grounded, and an eighth N-channel MOS transistor having a drain connected to said source of said sixth N-channel MOS transistor, a gate connected to said source of said fifth N-channel MOS transistor, and a source grounded, and a circuit pattern of each of said first, second, fifth, and sixth N-channel MOS transistors is electrically equivalent to elements included in said memory cell.

11. A memory according to claim 10, wherein said memory cell has a driver transistor for holding the data, and a transfer transistor for controlling transfer of the data held by said driver transistor, and each of said first, second, fifth, and sixth N-channel MOS transistors includes a circuit pattern electrically equivalent to said transfer transistor.

12. A semiconductor device comprising:
   an input buffer for receiving an external input signal, amplifying the input signal, and outputting the input signal;
   a decoder for receiving the input signal output from said input buffer, decoding the input signal, and outputting the input signal;
   a memory cell array which has a plurality of memory cells to output data from a memory cell selected on the basis of the decoded signal output from said decoder;
   a sense amplifier for receiving the data output from said memory cell array, amplifying the data, and outputting a signal;
   an output buffer for receiving the signal output from said sense amplifier amplifying the signal, and outputting an output signal;

a pulse generator for receiving the input signal and outputting a pulse delayed by a predetermined time; and equalizing means for receiving the pulse output from said pulse generator and equalizing a first pair of signal lines which connect an output terminal of said memory cell array to an input terminal of said sense amplifier and a second pair of signal lines which connect an output terminal of sense amplifier to an input terminal of said output buffer, wherein said memory cell has a driver transistor for holding the data, and a transfer transistor for controlling transfer of the data held by said driver transistor, and said pulse generator includes a circuit pattern electrically equivalent to said transfer transistor.

13. A semiconductor device comprising:

an input buffer for receiving an external input signal, amplifying the input signal, and outputting the input signal;

a decoder for receiving the input signal output from said input buffer, decoding the input signal, and outputting the input signal;

a memory cell array which has a plurality of memory cells to output data from a memory cell selected on the basis of the decoded signal output from said decoder;

a sense amplifier for receiving the data output from said memory cell array, amplifying the data, and outputting a signal;

an output buffer for receiving the signal output from said sense amplifier. amplifying the signal, and outputting an output signal;

a pulse generator for receiving the input signal and outputting a pulse delayed by a predetermined time; and equalizing means for receiving the pulse output from said pulse generator and equalizing a first pair of signal lines which connect an output terminal of said memory cell array to an input terminal of said sense amplifier and a second pair of signal lines which connect an output terminal of sense amplifier to an input terminal of said output buffer, wherein said pulse generator has a delay unit for receiving the input signal, delaying the input signal, and outputting the input signal, and a logic circuit for receiving the input signal and the input signal delayed by said delay unit, comparing a level of the input signal with that of the delayed input signal, and generating the pulse, and said delay unit includes an inverter array in which a plurality of inverters are connected in series, said inverter array having at least one inverter including the circuit pattern electrically equivalent to elements included in said memory cell.

14. A memory according to claim 13, wherein said memory cell has a driver transistor for holding the data, and a transfer transistor for controlling transfer of the data held by said driver transistor, and said delay unit includes a circuit pattern electrically equivalent to said transfer transistor.

15. A memory according to claim 13, wherein at least one inverter of said inverter array included in said delay unit has a P-channel MOS transistor having a source connected to a power supply voltage terminal and a gate supplied with the input signal and an N-channel MOS transistor having a drain connected to a drain of said P-channel MOS transistor, a gate supplied with the input signal, and a source grounded, and a circuit pattern of said N-channel MOS transistor is electrically equivalent to elements included in said memory cell.

16. A memory according to claim 15, wherein said memory cell has a driver transistor for holding the data, and a transfer transistor for controlling transfer of the data held by said driver transistor, and said N-channel MOS transistor includes a circuit pattern electrically equivalent to said transfer transistor.

17. A memory according to claim 13, wherein at least one inverter of said inverter array included in said delay unit has a P-channel MOS transistor having a source connected to a power supply voltage terminal and a gate supplied with the input signal, a first N-channel MOS transistor having a drain connected to a drain of said P-channel MOS transistor and a gate supplied with the input signal, a second N-channel MOS transistor having a drain connected to a source of said first N-channel MOS transistor, a gate connected to said power supply voltage terminal, and a source grounded, and a third N-channel MOS transistor having a drain connected to said power supply voltage terminal, a gate connected to said drain of said second N-channel MOS transistor, and a source grounded, and a circuit pattern of each of said first, second, and third N-channel MOS transistors is electrically equivalent to elements included in said memory cell.

18. A memory according to claim 17, wherein said memory cell has a driver transistor for holding the data, and a transfer transistor for controlling transfer of the data held by said driver transistor, said first N-channel MOS transistor includes a circuit pattern electrically equivalent to said transfer transistor, and each of said second and third N-channel MOS transistors includes a circuit pattern electrically equivalent to said driver transistor.

19. A memory according to claim 13, wherein at least one inverter of said inverter array included in said delay unit has a P-channel MOS transistor having a source connected to a power supply voltage terminal and a gate supplied with the input signal, a first N-channel MOS transistor having a drain connected to a drain of said P-channel MOS transistor, a gate supplied with the input signal, and a source grounded, and a second N-channel MOS transistor having a drain connected to said drain of said first N-channel MOS transistor, a gate connected to said gate of said first N-channel MOS transistor, and a source grounded, and a circuit pattern of each of said first and second N-channel MOS transistors is electrically equivalent to elements included in said memory cell.

20. A memory according to claim 19, wherein said memory cell has a driver transistor for holding the data, and a transfer transistor for controlling transfer of the data held by said driver transistor, and each of said first and second N-channel MOS transistors includes a circuit pattern electrically equivalent to said transfer transistor.

21. A memory according to claim 13, wherein at least one inverter of said inverter array included in said delay unit has a P-channel MOS transistor having a source connected to a power supply voltage terminal and a gate supplied with the input signal, a first N-channel MOS transistor having a drain connected to a drain of said P-channel MOS transistor and a gate supplied with the input signal, a second N-channel MOS transistor having a drain connected to said power supply voltage terminal and a gate connected to said gate of said first N-channel MOS transistor, a third N-channel MOS transistor having a drain connected to a source of said first N-channel MOS transistor, a gate connected to a source of said second N-channel MOS transistor, and a source grounded, and a fourth N-channel MOS transistor having a drain connected to said source of said second N-channel MOS transistor, a gate connected to said source of said first N-channel MOS transistor, and a gate grounded, and a circuit pattern of said first N-channel MOS transistor is electrically equivalent to elements included in said memory cell.

22. A memory according to claim 21, wherein said memory cell has a driver transistor for holding the data, and a transfer transistor for controlling transfer of the data held by said driver transistor, and said first N-channel MOS transistor includes a circuit pattern electrically equivalent to said transfer transistor.

23. A memory according to claim 13, wherein at least one inverter of said inverter array included in said delay unit has a P-channel MOS transistor having a source connected to a power supply voltage terminal and a gate supplied with the input signal, a first N-channel MOS transistor having a drain connected to a drain of said P-channel MOS transistor and a gate supplied with the input signal, a second N-channel MOS transistor having a drain connected to said power supply voltage terminal and a gate connected to said gate of said first N-channel MOS transistor, a third N-channel MOS transistor having a drain connected to a source of said first N-channel MOS transistor, a gate connected to a source of said second N-channel MOS transistor, and a source grounded, a fourth N-channel MOS transistor having a drain connected to said source of said second N-channel MOS transistor, a gate connected to said source of said first N-channel MOS transistor, and a gate grounded, a fifth N-channel MOS transistor having a drain connected to said power supply voltage terminal and a gate connected to said gate of said first N-channel MOS transistor, a sixth N-channel MOS transistor having a drain connected to said drain of said N-channel MOS transistor and a gate connected to said gate of said first N-channel MOS transistor, a seventh N-channel MOS transistor having a drain connected to a source of said fifth N-channel MOS transistor, a gate connected to a source of said sixth N-channel MOS transistor, and a source grounded, and an eighth N-channel MOS transistor having a drain connected to said source of said sixth N-channel MOS transistor, a gate connected to said source of said fifth N-channel MOS transistor, and a source grounded, and a circuit pattern of each of said first, second, fifth, and sixth N-channel MOS transistors is electrically equivalent to elements included in said memory cell.

24. A memory according to claim 23, wherein said memory cell has a driver transistor for holding the data, and a transfer transistor for controlling transfer of the data held by said driver transistor, and each of said first, second, fifth, and sixth N-channel MOS transistors includes a circuit pattern electrically equivalent to said transfer transistor.

* * * * *